United States Patent [19]
Ibusuki et al.

[11] Patent Number: 5,841,960
[45] Date of Patent: *Nov. 24, 1998

[54] METHOD OF AND APPARARTUS FOR AUTOMATICALLY GENERATING TEST PROGRAM

[75] Inventors: Takeshi Ibusuki; Shinji Miyahara, both of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 531,205

[22] Filed: Sep. 19, 1995

[30] Foreign Application Priority Data

Oct. 17, 1994 [JP] Japan ..................... 6-250325

[51] Int. Cl.⁶ ............................... G06F 11/263
[52] U.S. Cl. ..................... 395/183.08; 371/22.1
[58] Field of Search ............. 395/183.08, 183.09, 395/609, 183.01, 183.11, 615; 364/264.3; 371/27

[56] References Cited

U.S. PATENT DOCUMENTS

| | | |
|---|---|---|
| 4,228,537 | 10/1980 | Henkels et al. .............. 395/183.09 |
| 4,503,386 | 3/1985 | DasGupta et al. .............. 371/22.3 |
| 4,766,595 | 8/1988 | Gollomp .............. 395/183.09 |
| 4,862,399 | 8/1989 | Freeman .............. 364/580 |
| 4,933,941 | 6/1990 | Eckard et al. .............. 395/183.07 |
| 4,953,096 | 8/1990 | Wachi et al. .............. 364/550 |
| 4,984,239 | 1/1991 | Suzuki et al. .............. 371/3 |
| 5,107,498 | 4/1992 | Hogihara et al. .............. 395/183.12 |
| 5,271,000 | 12/1993 | Engbersen et al. .............. 370/244 |
| 5,319,647 | 6/1994 | Hosokawa et al. .............. 371/27 |
| 5,323,108 | 6/1994 | Marker, III et al. .............. 324/158.1 |
| 5,345,450 | 9/1994 | Saw et al. .............. 371/27 |
| 5,371,883 | 12/1994 | Gross et al. .............. 395/183.14 |
| 5,377,197 | 12/1994 | Patel et al. .............. 371/22.1 |
| 5,377,201 | 12/1994 | Clakradhas et al. .............. 371/27 |
| 5,410,552 | 4/1995 | Hosokawa .............. 371/27 |

*Primary Examiner*—Albert DeCady
*Assistant Examiner*—Scott T. Baderman
*Attorney, Agent, or Firm*—Staas & Halsey

[57] ABSTRACT

A test program generator system employs a method of automatically generating a test program for testing a hardware fault in a computer system. The method retrieves fault data from a fault management system and automatically inserts the fault data into a test program.

20 Claims, 19 Drawing Sheets

Fig.19

| | 32a | 32b | 32c | | 32 | | |
|---|---|---|---|---|---|---|---|
| CPU | TEST_1010 | 10 | TEST_1020 | 1 | ----- | ----- | --- |
| FPU | TEST_2000 | 0 | TEST_2010 | 5 | TEST_2020 | 2 | TEST_2030 | 1 |
| MMU | TEST_A000 | 2 | TEST_A010 | 5 | TEST_A100 | 1 | ----- | --- |
| CACHE | TEST_B000 | 1 | TEST_B010 | 2 | TEST_B200 | 3 | ----- | --- |

METHOD OF AND APPARARTUS FOR AUTOMATICALLY GENERATING TEST PROGRAM

BACKGROUND OF THE INVENTION

1. Field of the Invention

The present invention relates to a method of and apparatus for automatically inserting fault data about a computer hardware fault into a test program.

A computer system employs a fault management system that manages faults occurring in the designing and use of stages of the computer system.

The method and apparatus of the present invention check the fault management system and automatically generate a test program for testing a hardware fault.

2. Description of the Related Art

When a hardware fault occurs in a computer system, the operation that has caused the fault is registered in a fault management system. If the operation is not covered by existing test programs, an operator analyzes the fault and manually prepares a new test program for the fault.

This technique has the following problems:

(1) An operator who prepares test programs must always monitor faults to be registered in the fault management system. There is a risk that the operator may overlook newly registered faults.

(2) When data related to a fault is registered in the fault management system, the operator must pick up an instruction string from the data and must manually insert the instruction string in a test program. It takes a long time from the occurrence of a fault until the fault is reflected in a test program.

In this way, the conventional technique may overlook faults or untimely reflect faults in test programs. It is required, therefore, to provide a method and an apparatus capable of effectively generating a test program.

After a fault is corrected, a confirmation test must be carried out. The prior art forces the operator to manually select a confirmation test program, which causes the problem (2) mentioned above. It is required, therefore, to provide an apparatus for automatically selecting and executing a proper test program.

SUMMARY OF THE INVENTION

An object of the present invention is to provide a method of and an apparatus for checking a fault management system and automatically generating a test program accordingly.

In order to accomplish the object, the present invention provides an automatic test program generator system having a test program generator. The test program generator retrieves fault data from a fault management system that manages hardware faults. The test program generator picks up an instruction string out of the fault data and automatically inserts the instruction string into a test program.

The present invention also provides a method of automatically generating a test program for testing a hardware fault, including the steps of retrieving fault data from the fault management system and automatically integrating the fault data into a test program. The present invention also provides a system that achieves this method.

After fault data in the fault management system is reflected in a test program, a flag indicating this fact is set in the fault data in the fault management system. Information about the test program in which the fault data has been reflected is written in the fault management system.

The present invention employs a redundant instruction table. The table is used to look up and find an instruction string corresponding to a redundant expression contained in fault data stored in the fault management system. The instruction string found is inserted into a test program. The test program generator may automatically select one of test programs according to fault data stored in the fault management system so that the test program is executed after the fault is corrected. The test program generator may have a unit for checking instruction strings contained in a test program, to prevent an instruction string contained in fault data from being repeatedly written in the test program.

The present invention employs a table for relating hardware units to test units. The table is used to find a test unit and test program for a hardware unit that has caused a fault. The present invention also employs a table for relating hardware units to test programs. The table is used to find a test program proper for a hardware unit that has caused a fault. The present invention may employ a table for relating hardware units to test programs, each of the test programs being provided with the number of faults related to the test program. After a fault is corrected, the test programs are executed in order of the numbers of faults.

BRIEF DESCRIPTION OF THE DRAWINGS

The present invention will be more clearly understood from the description as set forth below with reference to the accompanying drawings, in which:

FIG. 19 shows a test program management table according to the tenth embodiment.

DESCRIPTION OF THE PREFERRED EMBODIMENTS

Figure 1:
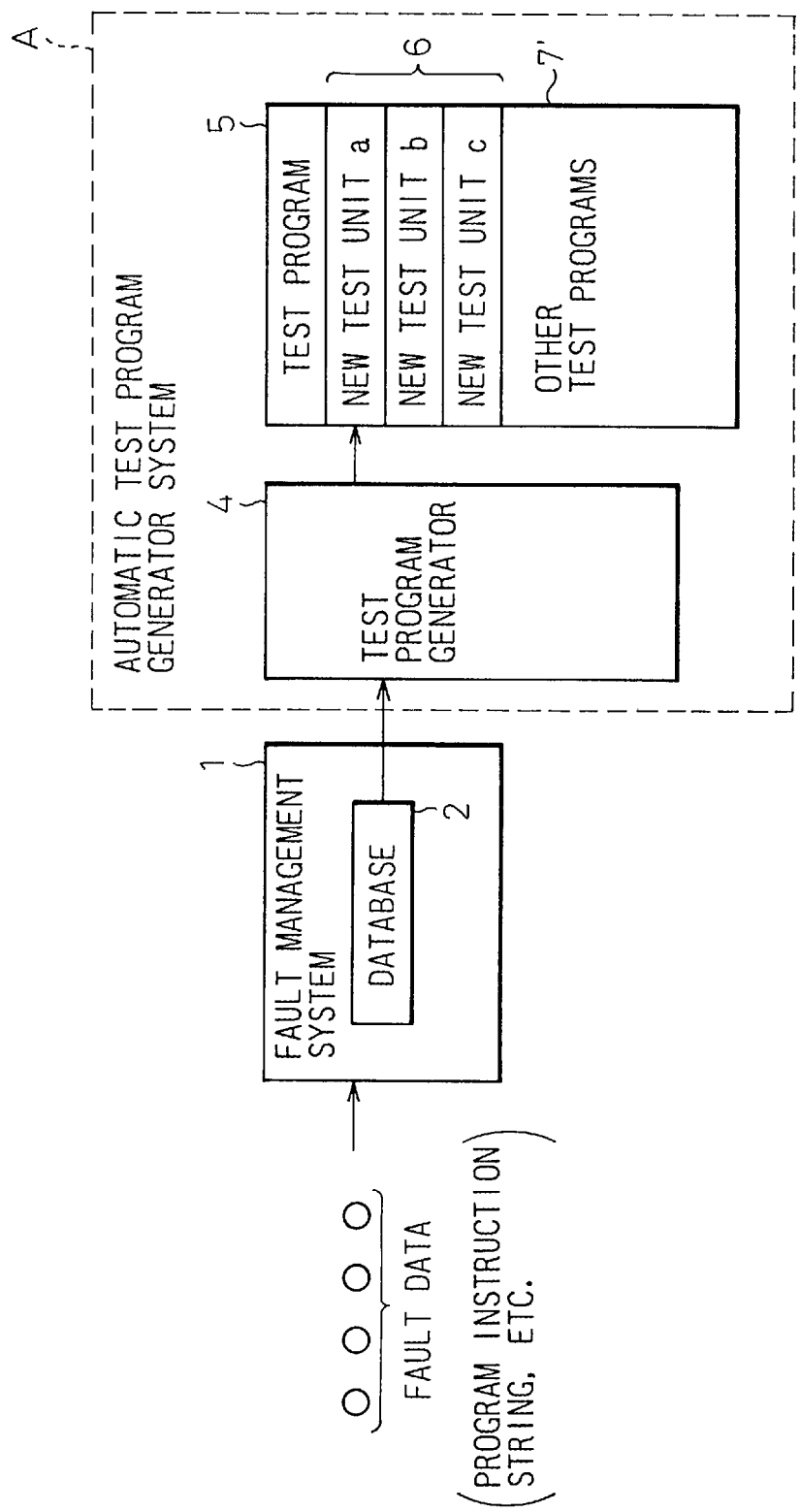
FIG. 1 shows a basic arrangement of the present invention.

FIG. 1 shows a basic arrangement of an automatic test program generator system according to the present invention.

A fault management system 1 has a database 2 for storing hardware fault data 3. The fault data 3 includes data for the hardware that has caused a fault and a program instruction string related to the fault.

A test program generator 4 is interlocked with the fault management system 1. The test program generator 4 retrieves fault data from the database 2 and inserts the fault data as a test unit 6 in a test program 5. The test program 5 has test units a, b, and c inserted by the test program generator 4. A required test program is picked out among the test programs 6 and 7'.

The operation of the automatic test program generator system A of FIG. 1 will now be explained.

If a hardware fault occurs, it is stored as fault data 3 in the database 2 of the fault management system 1. Usually, the fault data 3 is manually entered by an operator into the fault management system 1. An instruction that is related to the fault is provided with a special identifier such as DEFECT INST. The identifier is used as a key by the test program generator 4 to retrieve the instruction string from the database 2. The test program generator 4 adds the retrieved instruction string as a new test unit 6 to the existing test program 5.

Figure 2:
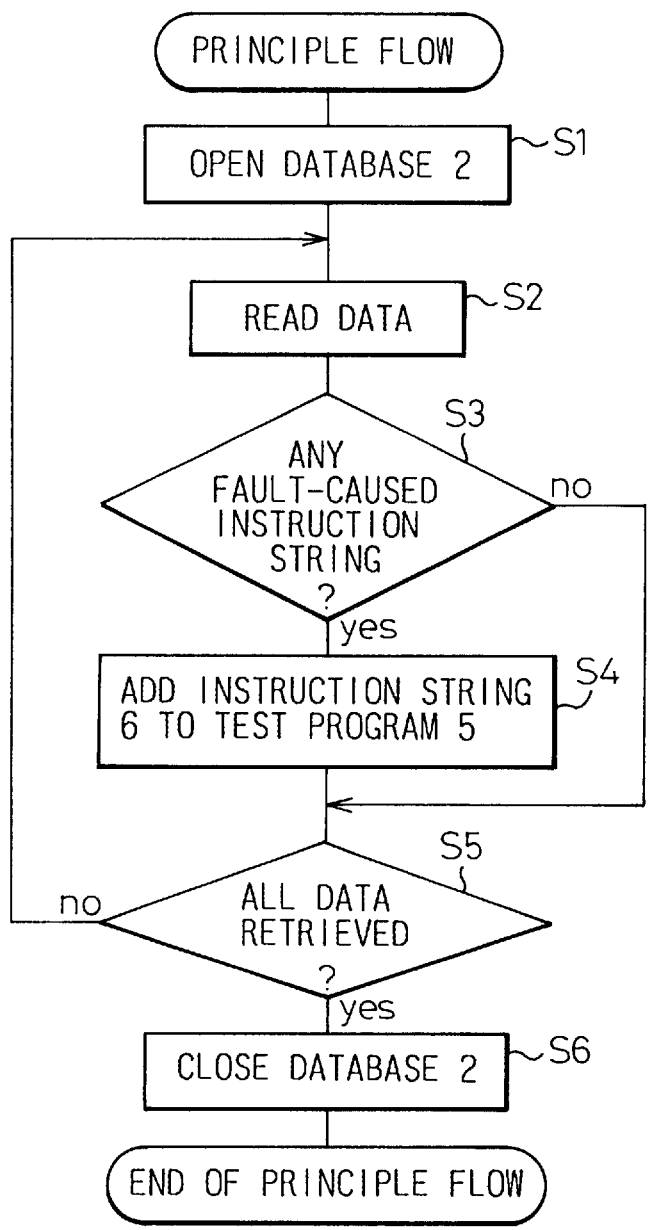
FIG. 2 is a flowchart showing the principle of the present invention.

FIG. 2 is a flowchart showing the operation of the automatic test program generator system A of FIG. 1.

In step S1, the test program generator 4 opens the database 2. In step S2, the test program generator 4 reads fault data from the database 2. Step S3 determines whether or not the fault data includes an instruction string. If it is included, step S4 adds the instruction string as a new test unit 6 to the test program 5. If no instruction string is included, step S5 determines whether or not all fault data have been retrieved from the database 2. If there is still fault data to retrieve, the flow returns to the step S2. If all fault data have been retrieved, step S6 closes the database 2.

The test program generator 4 may include a software simulator for logically simulating the operation of the hardware that has caused the fault. When the step S4 adds the instruction string as the test unit 6 to the test program 5, an expected value of the instruction string simulated by the simulator is automatically added to the test program 5.

As explained above, the test program generator 4 retrieves fault data, which contains a program instruction string related to a hardware fault, from the database 2 and automatically adds the fault data to the test program 5. Namely, the present invention surely and easily prepares a test program that effectively carries out a test.

Figure 3:
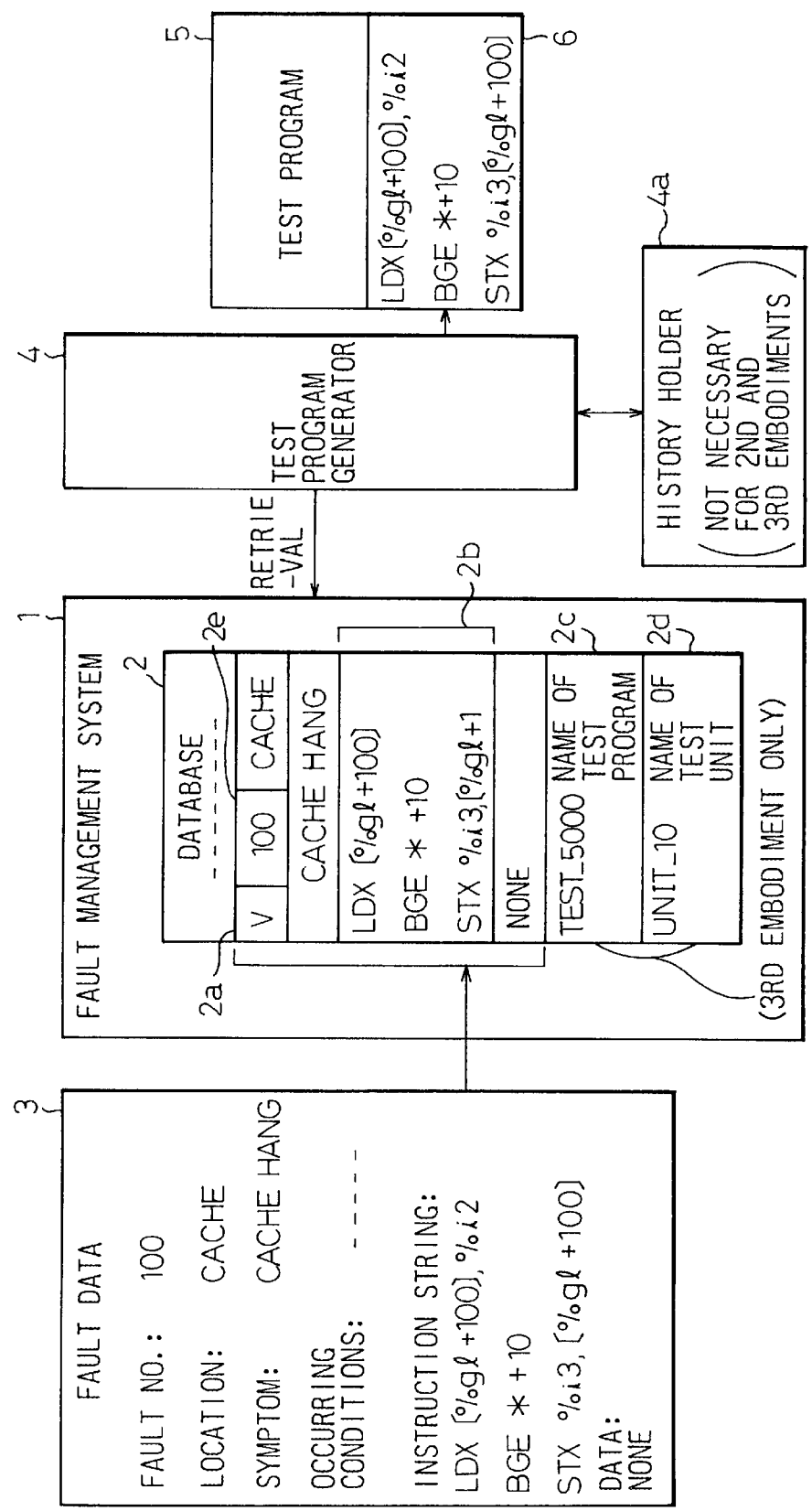
FIG. 3 shows a first embodiment of the present invention.

FIG. 3 shows an automatic test program generator system according to the first embodiment of the present invention.

A fault management system 1 has a database 2 for storing fault data 3. A test program generator 4 retrieves the fault data from the database 2 and inserts a new test unit 6 into a test program 5 accordingly. A history holder 4a holds a last fault number. The last fault number is used to retrieve fault data from the database 2.

The operation of the first embodiment will be explained.

The fault data 3 includes a fault number, the location of a fault, the symptom of the fault, the occurring conditions of the fault, etc. Instruction data related to the fault is also included in the fault data 3. In FIG. 3, such instruction data is unclear. When fault data is entered in the fault management system 1, the system 1 registers the fault data in the database 2.

The test program generator 4 fetches a last fault number from the history holder 4a and reads fault data having a number that follows the last fault number from the database 2. Namely, the test program generator 4 retrieves an instruction string 2b from the database 2 according to a fault number 2e, and adds the instruction string 2b as a new test unit 6 to the test program 5. The fault number 2e is saved in the history holder 4a. If a plurality of fault numbers are obtained as a result of reading the database 2, the last one of them is saved in the history holder 4a, so that new fault data will be fetched from the database 2 next time.

Each piece of fault data in the database 2 has a validity flag 2a. If the flag 2a is "V," the fault data in question is not read yet. Once the fault data is read, the flag 2a is changed to "N." The flag 2a is used by the second and third embodiments to be explained later. The name 2c of a test program and the name 2d of a test unit of FIG. 3 are used by the third embodiment.

Figure 4:
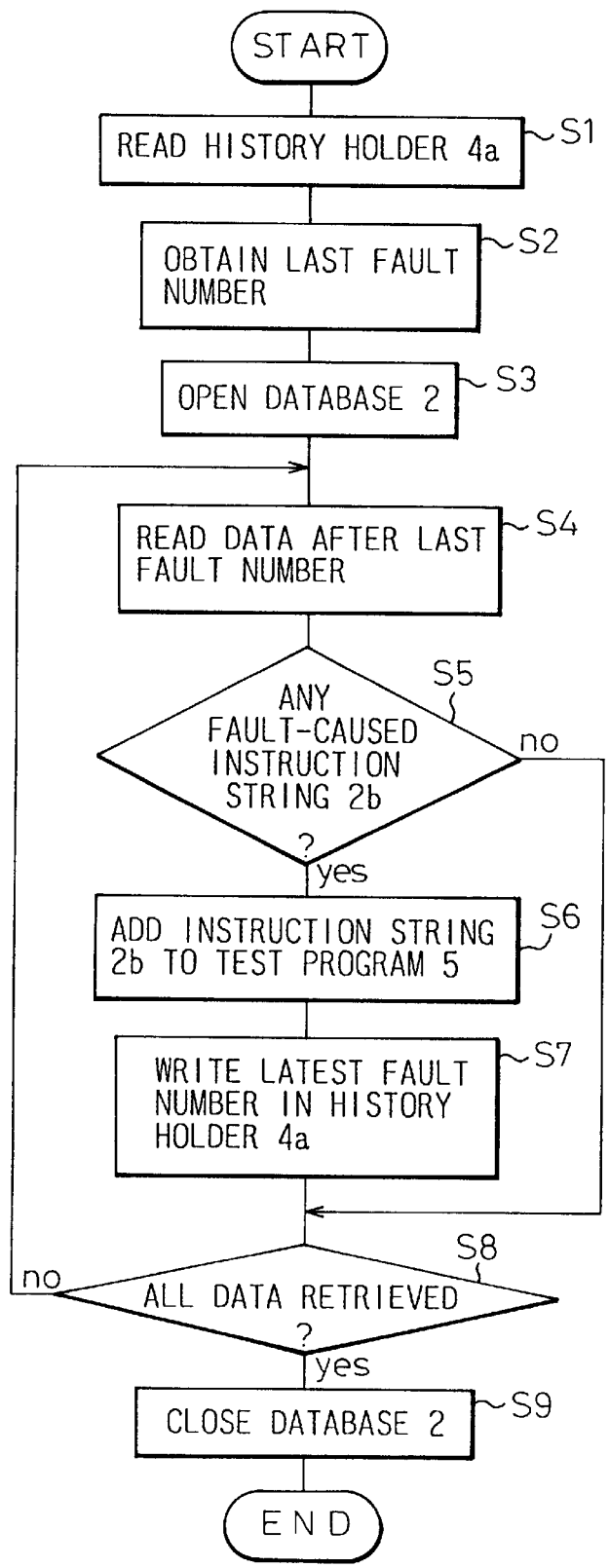
FIG. 4 is a flowchart showing the operation of the first embodiment.

FIG. 4 is a flowchart showing the operation of the first embodiment of the present invention.

In step S1, the test program generator 4 reads the history holder 4a. In step S2, the test program generator 4 fetches a last fault number from the history holder 4a. Step S3 opens the database 2. In step S4, the test program generator 4 reads fault data from the database 2 according to the fault number.

In step S5, the test program generator 4 determines whether or not the fault data has an instruction string 2b. If it has no instruction string, the flow goes to step S8. If it has the instruction string 2b, the test program generator 4 adds the instruction string 2b to the test program 5 in step S6. If there is data related to the instruction string 2b, the data is also added to the test program 5. At this time, an expected value of the logic operation of the instruction string 2b may be simulated by a software simulator and may be added to the test program 5, as explained with reference to the step S4 of FIG. 2. This is applicable to any embodiment mentioned below.

Step S7 writes a last fault number (100 in FIG. 3) in the history holder 4a. The step S8 determines whether or not the test program generator 4 has retrieved all fault data from the database 2. If not, the flow returns to the step S4. If all data have been retrieved, step S9 closes the database 2.

Figure 5:
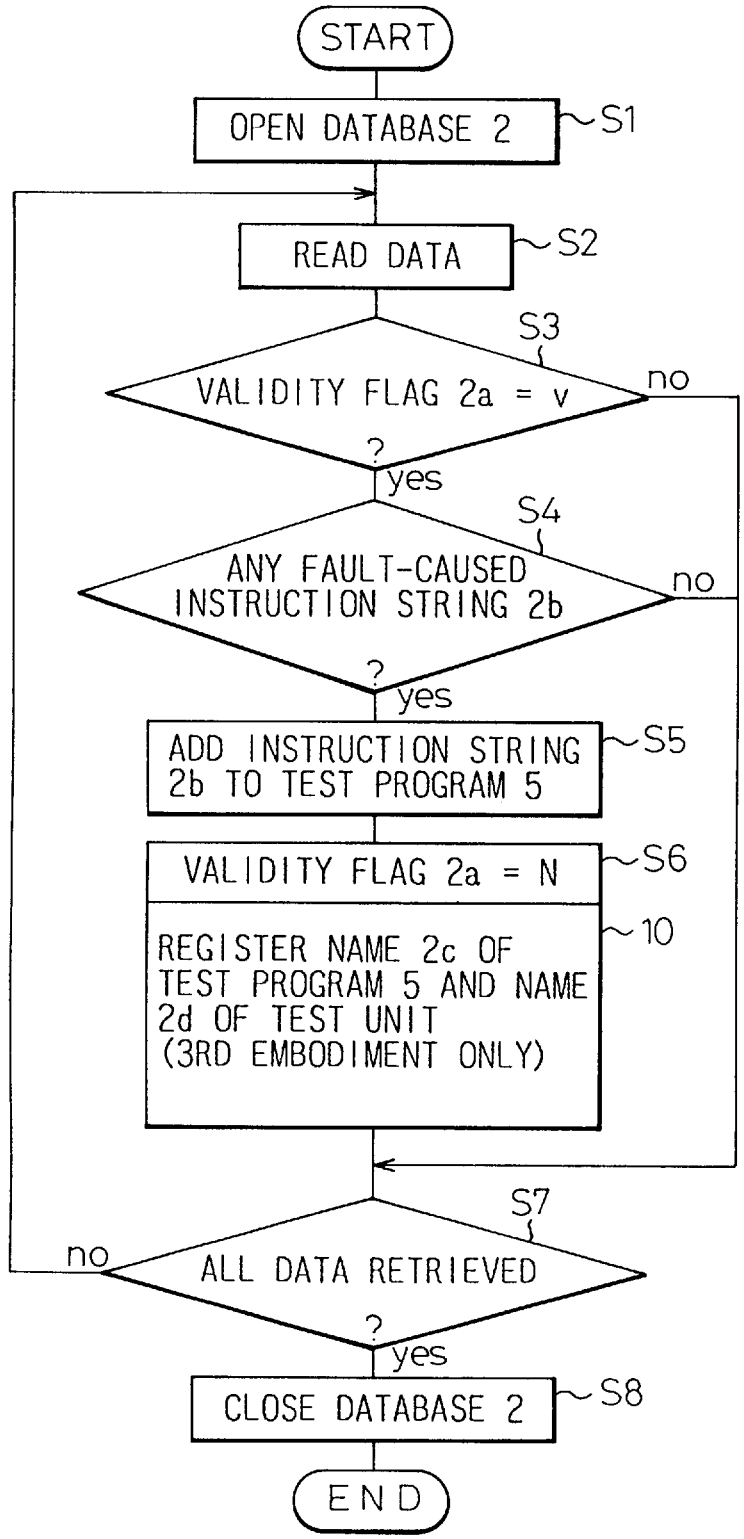
FIG. 5 is a flowchart showing the operations of second and third embodiments of the present invention.

FIG. 5 is a flowchart showing the second and third embodiments of the present invention.

The second and third embodiments arrange the validity flag 2a in each piece of fault data stored in the database 2, and therefore, omit the history holder 4a. The name 2c of a test program and the name 2d of a test unit of FIG. 3 are used only by the third embodiment.

The second embodiment will be explained with reference to the flowchart of FIG. 5.

Step S1 opens the database 2. In step S2, the test program generator 4 reads the validity flag 2a and fault number 2e of each piece of fault data stored in the database 2. In step S3, the test program generator 4 determines whether or not the validity flag 2a is V. If it is not V, the flow jumps to step S7, and if it is V, step S4 determines whether or not the fault data has an instruction string 2b. If it has no instruction string, the flow jumps to the step S7.

If the fault data has the instruction string 2b, the test program generator 4 adds the instruction string 2b to the test program 5 in step S5. In step S6, the test program generator 4 changes the validity flag 2a from V to N.

In the step S7, the test program generator 4 determines whether or not all fault data have been retrieved from the database 2. If not, the flow returns to the step S2. If all fault data have been retrieved, step S8 closes the database 2.

The third embodiment of the present invention will be explained next with reference to the flowchart of FIG. 5. In addition to the steps of the second embodiment, the third embodiment includes a process 10, i.e., a hatched part of FIG. 5.

After the test program generator 4 adds the instruction string 2b to the test program 5 in the step S5 and sets the validity flag 2a to N in the step S6, the process 10 writes the name 2c of the test program 5 and the name 2d of the test unit in the fault data in question stored in the database 2. The other steps of the third embodiment are the same as those of the second embodiment.

Figure 6:
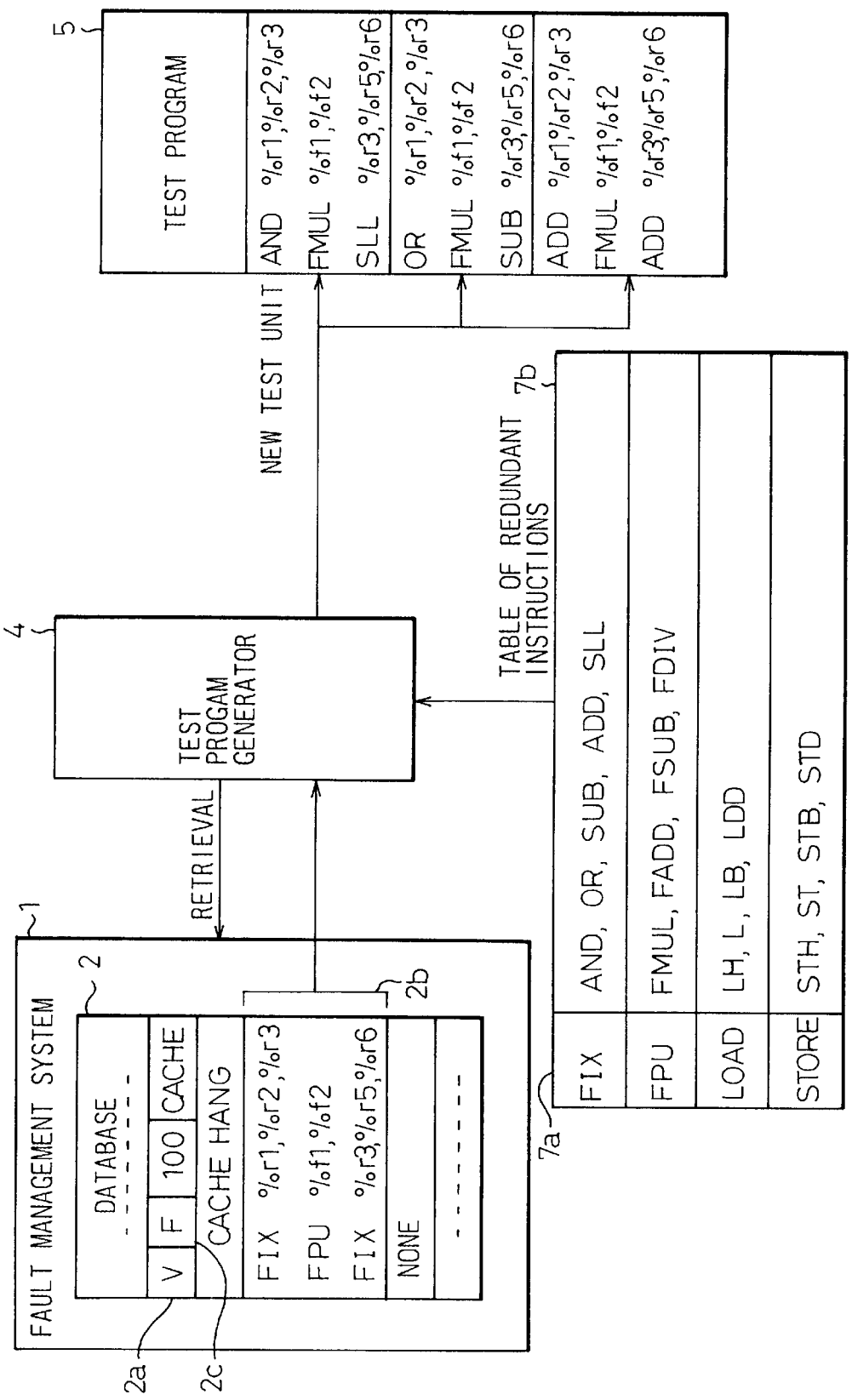
FIG. 6 shows a fourth embodiment of the present invention.

FIG. 6 shows the fourth embodiment of the present invention.

When a fault occurs with a given instruction string, the same fault will occur if an instruction string of the same kind is inserted in a test program to test the fault. Inserting instruction strings of the same kind in test programs will find undetected faults.

For example, the following instruction string may cause a fault:

No. Instructions
1 AND % r1, % r2, % r3
2 FMUL % f1, % f2
3 OR % r4, % r5, % r6

Then, the following instruction string, which is substitutable for the above instruction string, may cause the same fault:

No. Instructions
1 ADD % r1, % r2, % r3
2 FMUL % f1, % f2
3 SUB % r4, % r5, % r6

A write register of No. 1 interferes with a source register of No. 3, and the rating between them is dependent on the floating-point instruction FMUL. If these conditions are met, the instructions of Nos. 1 and 3 will be substituted by instructions of the same kind. Namely, the instruction string of:

No. Instructions
1 AND % r1, % r2, % r3
2 FMUL % f1, % f2
3 OR % r4, % r5, % r6 will be substituted by the following instruction string:

No. Instructions
1 FIX % r1, % r2, % r3
2 FMUL % f1, % f2
3 FIX % r4, % r5, % r6

Here, the instructions AND and OR are substituted each by the instruction FIX. The instruction FIX is not an existing instruction but represents any fixed-point operation instruction.

In this way, an instruction string related to a fault may be replaced with a redundant expression. This results in generating a plurality of test cases according to a piece of fault data and increasing test variations.

The fourth embodiment of the present invention for generating a plurality of test cases from a piece of fault data will be explained with reference to FIG. 6.

A fault management system 1 has a database 2. A test program generator 4 adds new test units 6 to a test program 5. A redundant instruction table 7 is referred to when creating the new test units 6.

The operation of the fourth embodiment will now be explained.

Each piece of fault data stored in the database 2 has a fault number (100 in the figure), a fault location (CACHE), a fault symptom (CACHE HANG), and the conditions (2b) under which the fault occurs. If data related to the fault is clear, the data is also described. In the example of FIG. 6, there is no such data.

An operator enters a redundant expression 2b, if appropriate, in the fault data stored in the database 2. A flag 2c' is set to F to indicate that there is a redundant expression.

The test program generator 4 reads the fault data out of the database 2. The test program generator 4 gets the instruction string 2b and recognizes from the flag 2c' of F that the instruction string 2b includes a redundant expression. Then, the test program generator 4 refers to the redundant instruction table 7, finds the redundant expression in column 7a of the table 7, and randomly selects a corresponding instruction in a column 7b of the table 7. The selected instruction is used to prepare a new test unit 6. To prepare a plurality of test units, the above processes are repeated.

Figure 7:
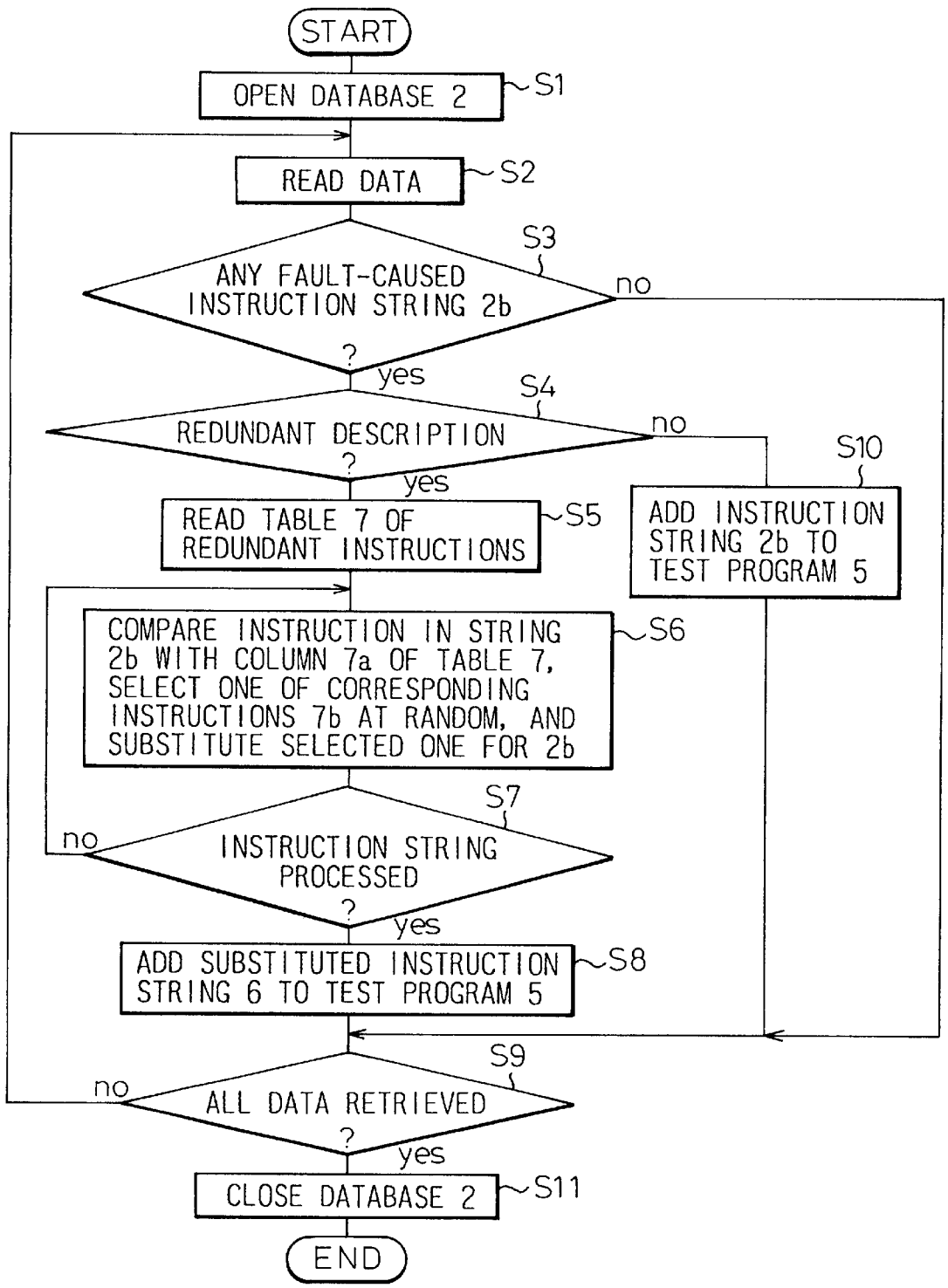
FIG. 7 is a flowchart showing the operation of the fourth embodiment.

FIG. 7 is a flowchart showing the operation of the fourth embodiment.

Step S1 opens the database 2. In step S2, the test program generator 4 reads fault data.

In step S3, the test program generator 4 determines whether or not the fault data has an instruction string 2b. If it has no instruction string, the flow goes to step S9. If it has an instruction string, step S4 determines whether or not the instruction string includes a redundant expression according to the flag 2c'. If it includes no redundant expression, the flow goes to step S10.

If it includes a redundant expression, the test program generator 4 refers to the redundant instruction table 7 in step S5. In step S6, the test program generator 4 searches the column 7a of the table 7 for the redundant expression, and randomly selects an instruction in the column 7b corresponding to the column 7a where the redundant expression is found. The selected instruction is substituted for the redundant expression in the instruction string 2b. Step S7 determines whether or not the instruction string 2b has been completely processed. If not, the flow returns to the step S6. If the instruction string 2b has been completely processed, step S8 adds the instruction string 2b to the test program 5.

Step S9 determines whether or not all fault data have been retrieved from the database 2. If not, the flow returns to the step S2. If all fault data have been retrieved, step S11 closes the database 2. If the instruction string 2b includes no redundant expression in the step S4, the step S10 adds the instruction string 2b as it is to the test program 5.

Figure 8:
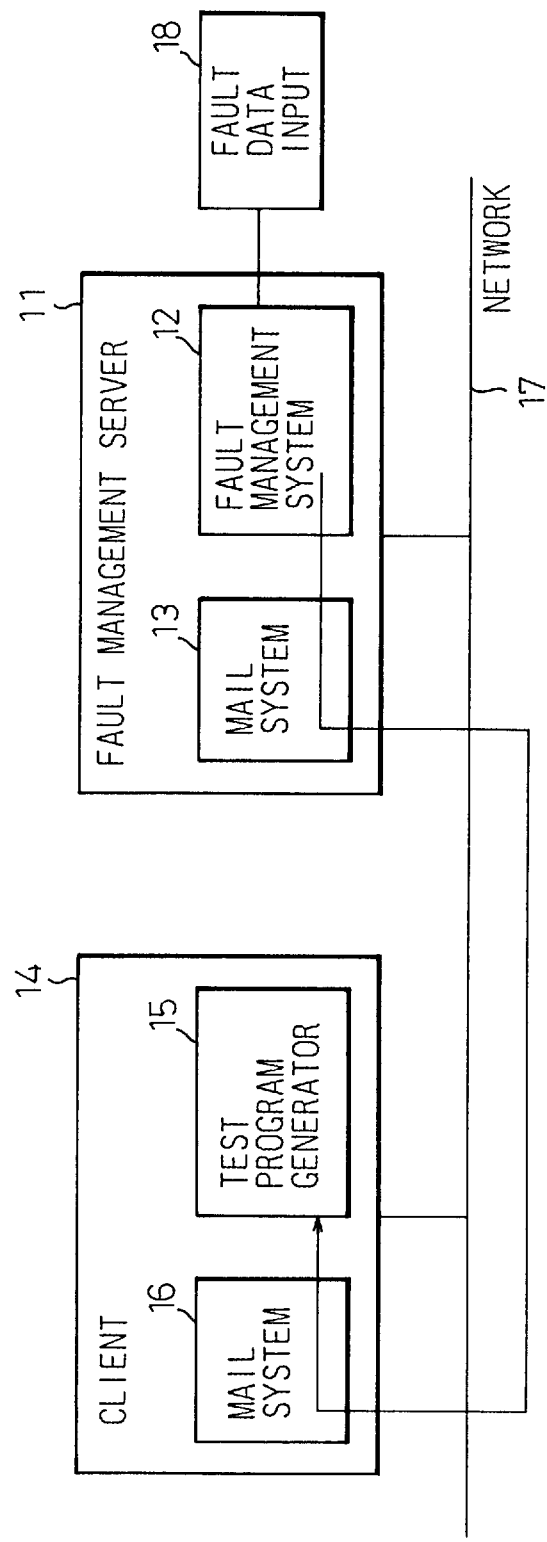
FIG. 8 shows a fifth embodiment of the present invention.

FIG. 8 shows the fifth embodiment of the present invention.

A database to manage faults is usually very large, and therefore, it takes a long time to retrieve fault data out of the database. The fifth embodiment generates a test program without a database.

A fault management server 11 has a fault management system 12 and a mail system 13. A client 14 has a test program generator 15 and a mail system 16. The server 11 and client 14 are connected to each other through a network 17 such as a LAN. Fault data 18 is entered by an operator.

The operator registers the fault data 18 in the fault management system 12 serving as a database. The fault data 18 is automatically transferred to the client 14 from the mail system 13. The mail system 16 of the client 14 receives the fault data, and the test program generator 15 is automatically activated to analyze the fault data. If the fault data is new, a test program is generated as mentioned above.

Figure 9:
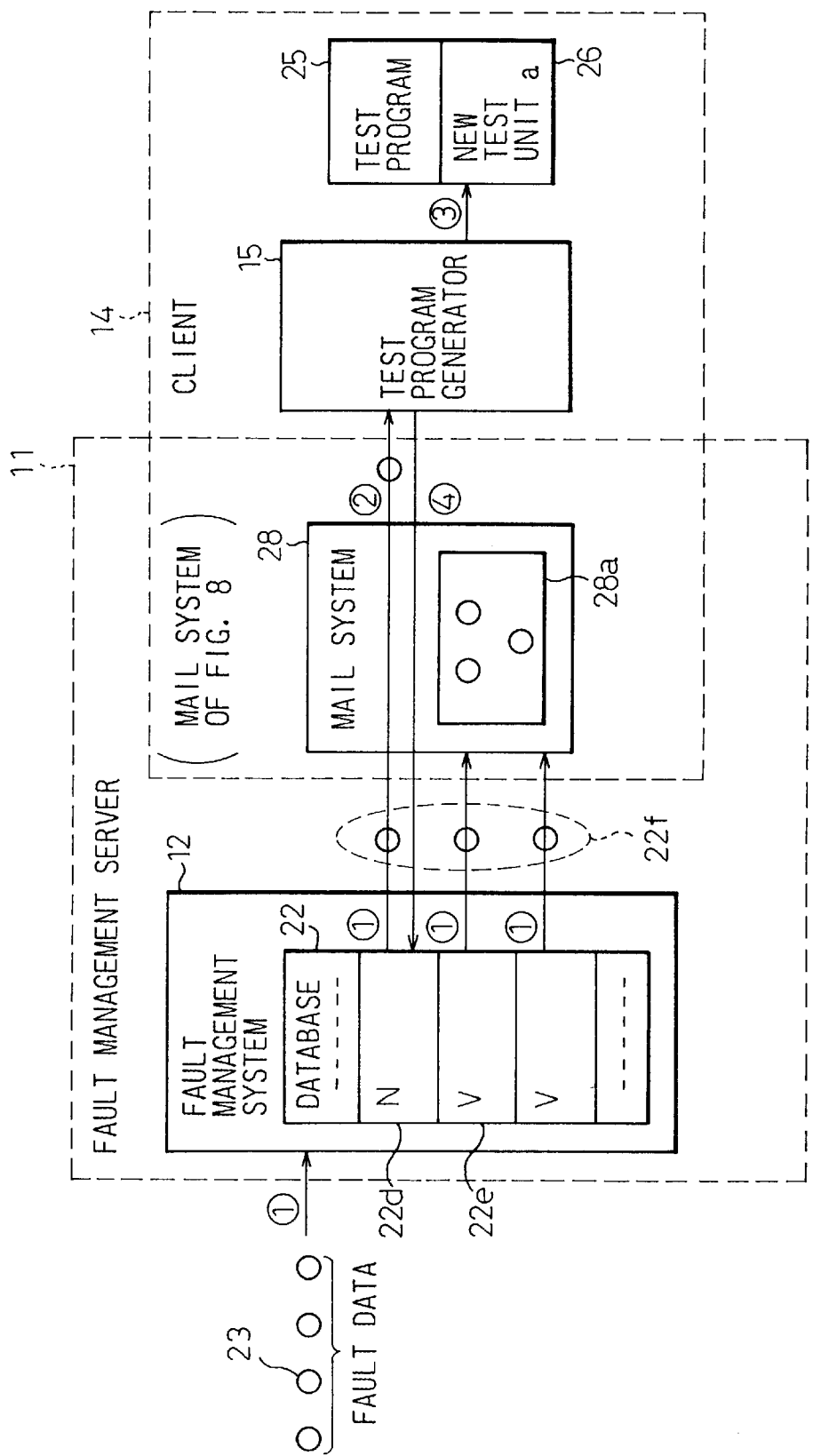
FIG. 9 shows the fifth embodiment.

FIG. 9 shows the details of the fifth embodiment.

The fault management server 11 has the fault management system 12, which includes a database 22. The client 14 has the test program generator 15. Fault data 23 relates to a hardware fault. An existing test program 25 may have a new test unit 26. A mail system 28 is included in an operation system. The mail system 28 represents the mail system 13 of the server 11 and the mail system 16 of the client 14.

The operation of the fifth embodiment will now be explained.

The fault data 23 is registered in the database 22 of the fault management system 12. A fault number, an instruction string, and data contained in the fault data 23 are transferred as a packet 22f to the test program generator 15 through the mail system 28. The mail system 28 has a spool 28a that holds the packet 22f until the test program generator 15 receives the packet 22f. Once the test program generator 15 receives the packet 22f, the spool 28a is deleted.

The test program generator 15 creates a new test unit 26 according to the packet 22f as mentioned above. Upon receiving an acknowledgment from the client 14, the fault management system 12 changes a flag 22d of the fault data stored in the database 22 from V to N to indicate that the fault data has been reflected in the test program 25. Flags of the other pieces of fault data are each V because they have not yet been received by the client 14.

Figure 10C:
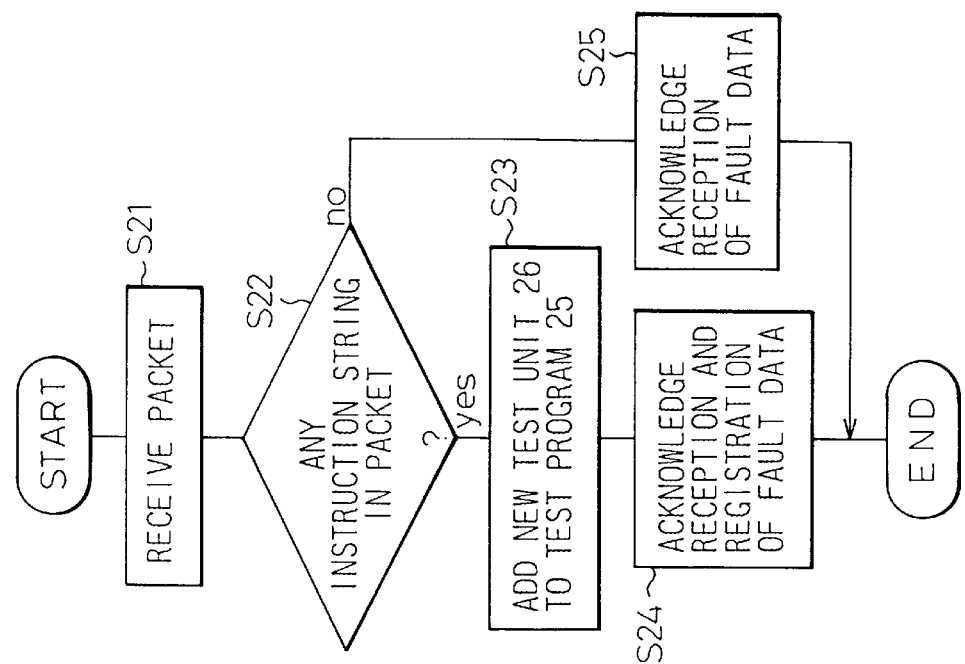
FIG. 10C is a flowchart showing the operation of a test program generator according to the fifth embodiment.
Figure 10B:
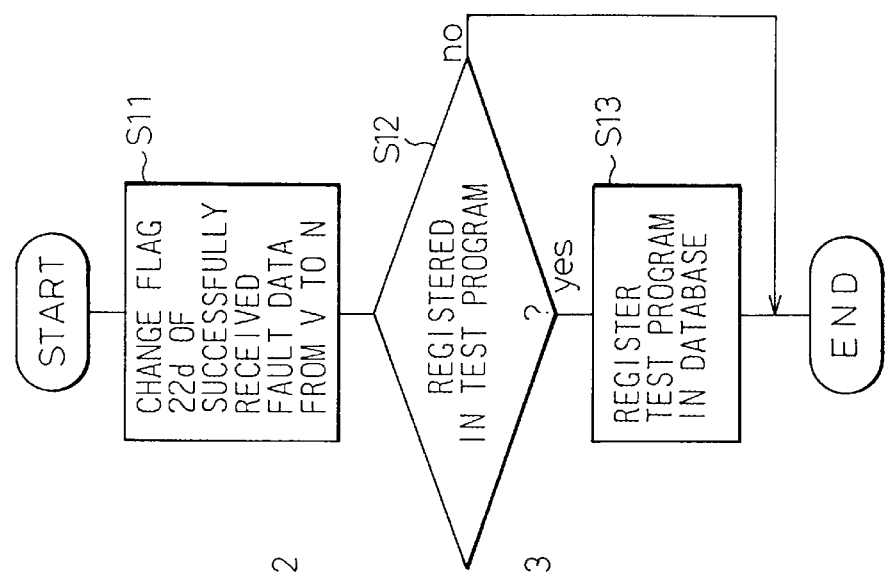
FIG. 10B is a flowchart showing the operation of a receiver of the fault management system according to the fifth embodiment.
Figure 10A:
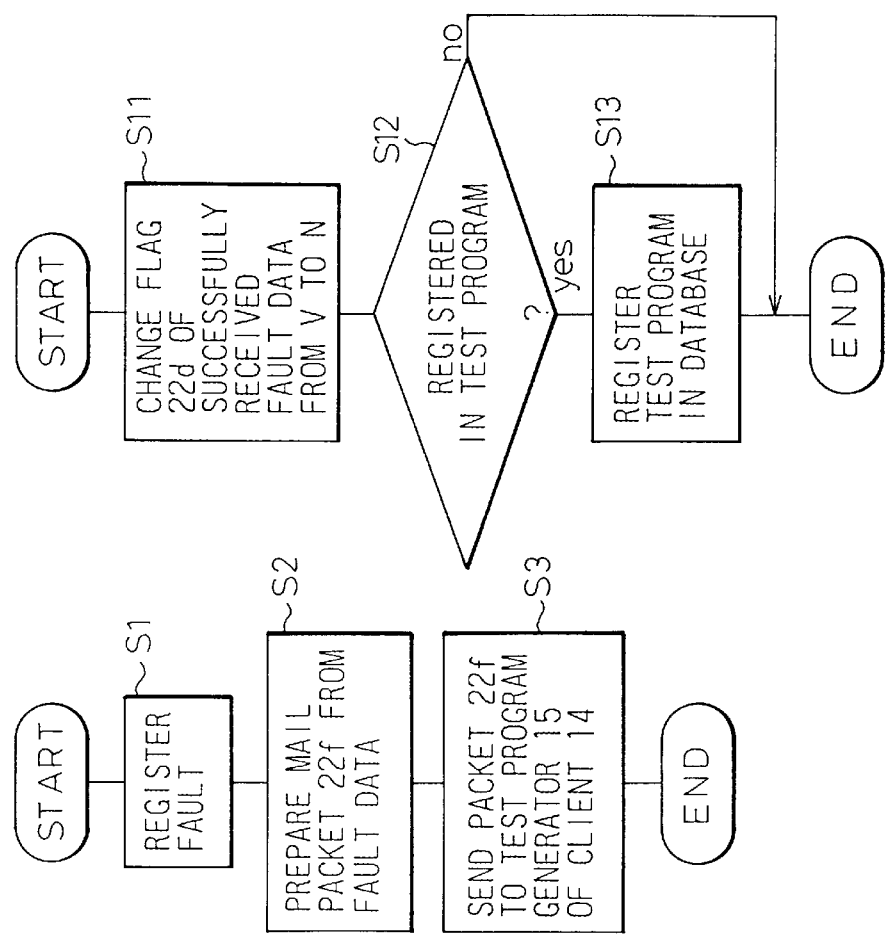
FIG. 10A is a flowchart showing the operation of a transmitter of a fault management system according to the fifth embodiment.

FIGS. 10A to 10C are flowcharts showing the operations of the fifth embodiment, in which FIG. 10A shows the mail system 13 serving as a transmitter of the fault management system 12, FIG. 10B shows the mail system 16 serving as a receiver of the client 14, and FIG. 10C shows the test program generator 15.

In FIG. 10A, step S1 registers fault data in the database 22. Step S2 forms a packet 22f of a fault number, an instruction string, etc., contained in the fault data. Step S3 sends the packet 22f from the mail system 13 of the server 11 to the test program generator 15 of the client 14.

In FIG. 10B, step S11 changes a flag 22d of the fault data stored in the database 22 from V to N after the fault data is successively received by the client 14. Step S12 determines whether or not the fault data has been registered in the test program 25. If not, the flow ends, and if it has been registered, step S13 registers information about the test program 25 in the database 22.

In FIG. 10C, step S21 receives the packet 22f. Step S22 determines whether or not the packet 22f includes an instruction string. If it includes an instruction string, step S23 adds the instruction string as a new test unit 26 to the test program 25.

Step S24 informs the fault management system 12 that the fault data has been received and registered in the test program 25. At the same time, information about the test program 25 is sent to the fault management system 12. If the packet 22f includes no instruction string in the step S22, step S25 informs the fault management system 12 that the fault data has been received.

Figure 11:
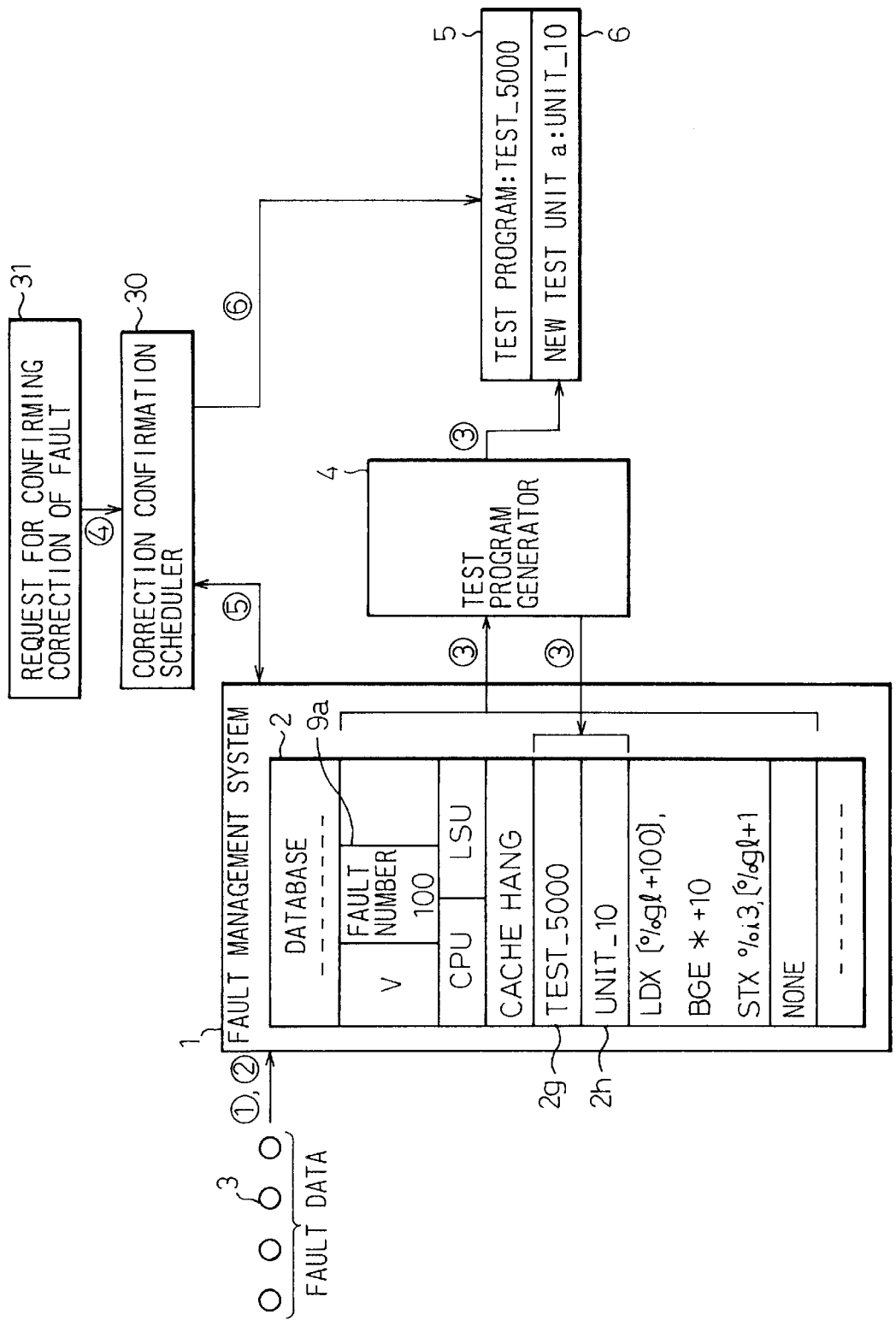
FIG. 11 shows a sixth embodiment of the present invention.

FIG. 11 shows the sixth embodiment of the present invention.

After a fault caused during the logical designing of hardware is corrected, a test program related to the fault must be again executed to confirm whether or not the fault occurs again. Generally, it takes a long time to execute the test program. Namely, a long time will be wasted until an instruction string related to the fault is executed in the test program. The sixth embodiment employs a scheduler to execute only a required instruction string, to reduce the time for checking a corrected fault.

In FIG. 11, a fault management system 1 has a database 2 that stores fault data 3. A test program generator 4 inserts a new test unit 6 into a test program 5. The scheduler 30 receives a request 31 for checking a corrected fault. In this example, a fault having a fault number 100 is going to be tested.

The fault data 3 includes the fault number, a location, a symptom, and conditions under which the fault occurs. The fault data 3 is registered in the database 2.

The test program generator 4 reads each piece of fault data from the database 2. Each piece of fault data stored in the database 2 has a validity flag 2a. If a given piece of fault data is not yet reflected in a test program, the flag 2a thereof is V. Accordingly, the test program generator 4 retrieves each piece of fault data having a validity flag 2a of V, reflects the fault data in the test program 5, and changes the flag 2a from V to N. After generating the test program 5, the test program generator 4 gets the name 2g of a test program "TEST 5000" and the name 2h of a test unit "UNIT 10."

After the fault having the fault number of 100 is corrected, an operator instructs the scheduler 30 to confirm the corrected fault. The scheduler 30 reads the fault data out of the database 2 according to the fault number 9a of 100, to get the name 2g of the test program "TEST 5000" and the name 2h of the test unit "UNIT 10." Then, the scheduler 30 executes the test program "TEST 5000" with the unit name "UNIT 10" as a parameter.

Figure 12:
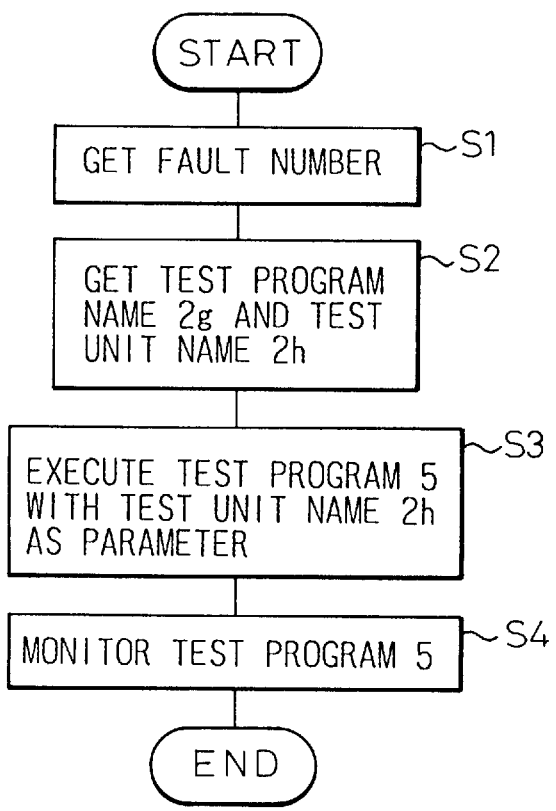
FIG. 12 is a flowchart showing the operation of the sixth embodiment.

FIG. 12 is a flowchart showing the operation of the sixth embodiment.

In step S1, an operator enters a fault number 9a to be tested. Step S2 retrieves fault data from the fault management system 1 according to the fault number 9a, to get the name 2g of a test program and the name 2h of a test unit. Step S3 runs the test program 5 having the name 2g with the test unit having the name 2h as a parameter. In step S4, the scheduler 30 monitors the test program 5 until it is completely executed.

Figure 13:
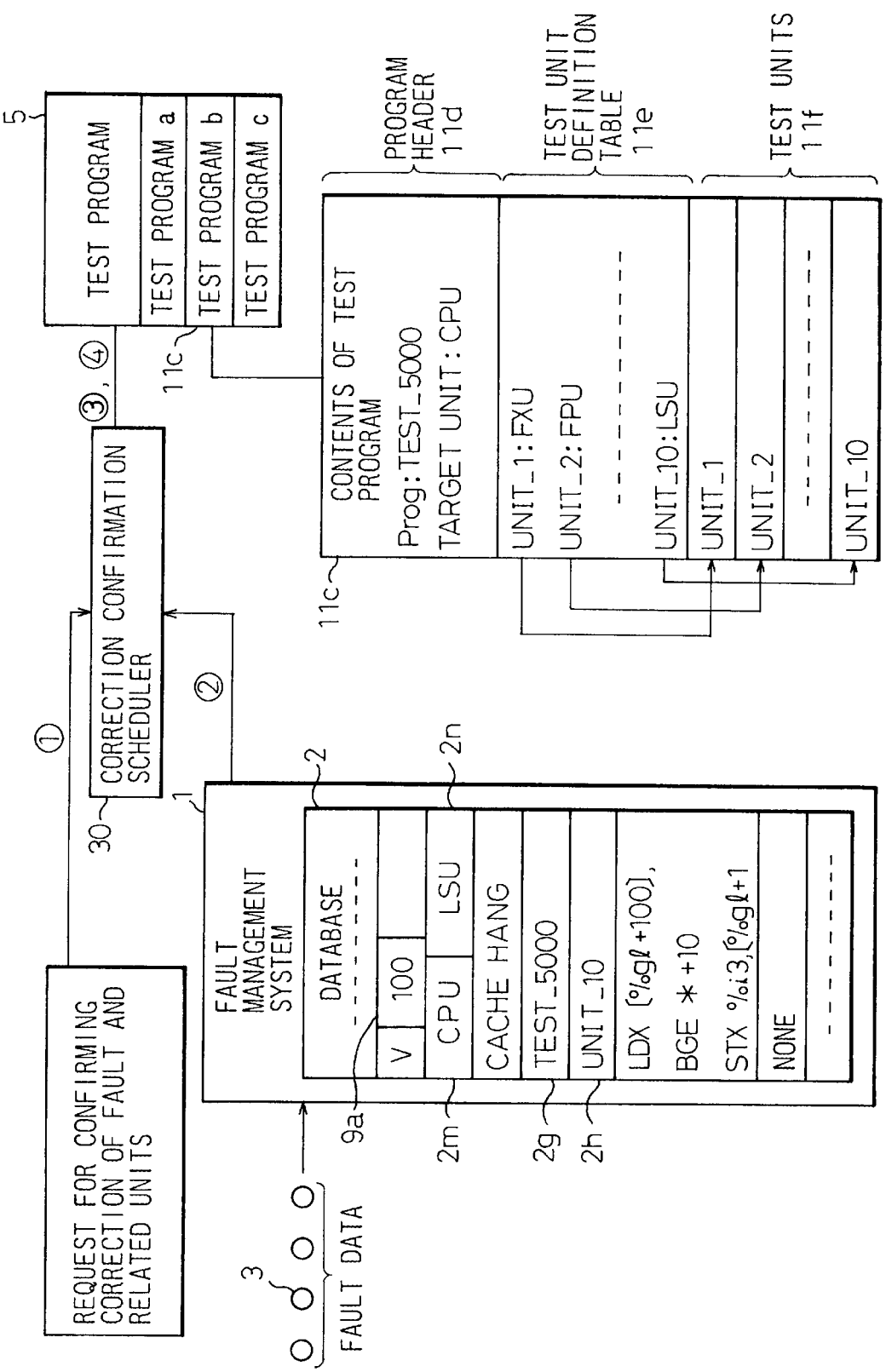
FIG. 13 shows a seventh embodiment of the present invention.

FIG. 13 shows the seventh embodiment of the present invention.

The sixth embodiment mentioned above runs only a test program or a test unit related to a fault. The seventh embodiment runs all test programs or test units related to a hardware block that includes a fault location. This results in checking the influence of the correction of a fault on the other parts.

In FIG. 13, a fault management system 1 has a database 2 that stores fault data 3. A test program 5 is a group of test programs a, b, c, and the like. The contents 11c of the test program c are shown in the figure as an example. The test program c includes a program header 11d that holds the name of a test program and a target hardware unit. The test program c also has a test unit definition table 11e showing the relationship between test units and hardware units. The table 11e is referred to according to the name of a test unit or a target hardware subunit, to execute only a required test unit. The test program 11c includes test units 11f.

The operation of the seventh embodiment will now be explained. After the fault having the fault number of 100 is corrected, an operator instructs the scheduler 30 to confirm the correction of the fault. Namely, an instruction string related to the fault is executed, and then, all test programs related to the hardware block in which the fault has occurred are executed. In FIG. 13, the hardware block to be tested is an LSU (load and store unit), which is a subunit of a CPU.

The scheduler 30 reads the database 2 according to the fault number of 100, to get the name 2g of a test program "TEST 5000," the name 2h of a test unit "UNIT 10," a hardware unit 2m "CPU", and a hardware subunit 2n "LSU".

The scheduler 30 firstly executes the test unit "UNIT 10" related to the fault. Then, the scheduler 30 finds a test program 5 related to the hardware unit 2m "CPU" and executes the test program with the hardware subunit 2n "LSU" as a parameter.

Figure 14:
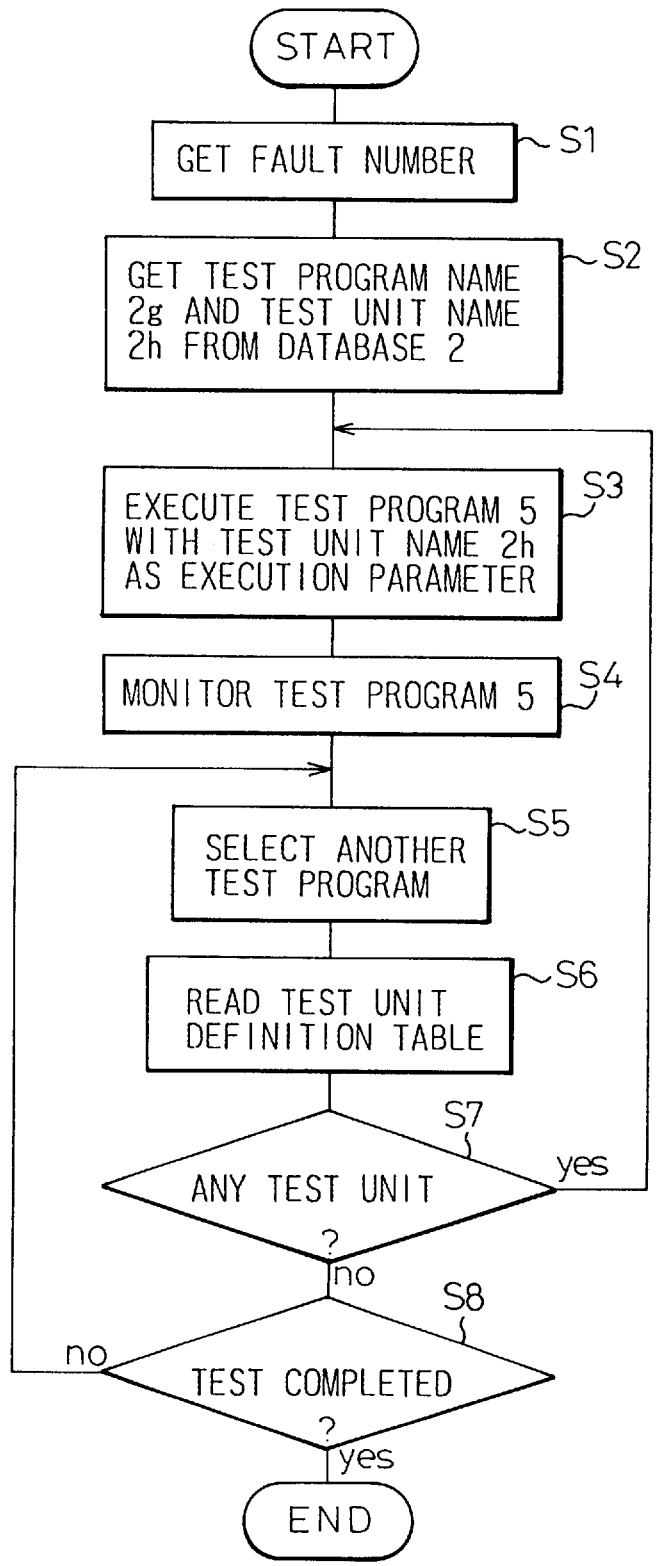
FIG. 14 is a flowchart showing the operation of the seventh embodiment.

FIG. 14 is a flowchart showing the operation of the seventh embodiment.

Step S1 reads the fault number of fault data to be checked. Step S2 reads the name 2g of a test program "TEST 5000" and the name 2h of a test unit "UNIT 10" out of the database 2 according to the fault number. Step S3 runs the test program "TEST 5000" with the test unit "UNIT 10" as a parameter. In step S4, the scheduler 30 monitors the test program until it is completely executed.

Step S5 selects another test program. Step S6 reads the test unit definition table 11e of this test program. Step S7 determines whether or not the test program includes the target hardware unit. If it includes the target hardware unit, the flow returns to the step S3, and if not, step S8 determines whether or not all test programs have been checked. If not, the flow returns to the step S5. If all test programs have been checked, the flow ends.

Figure 15:
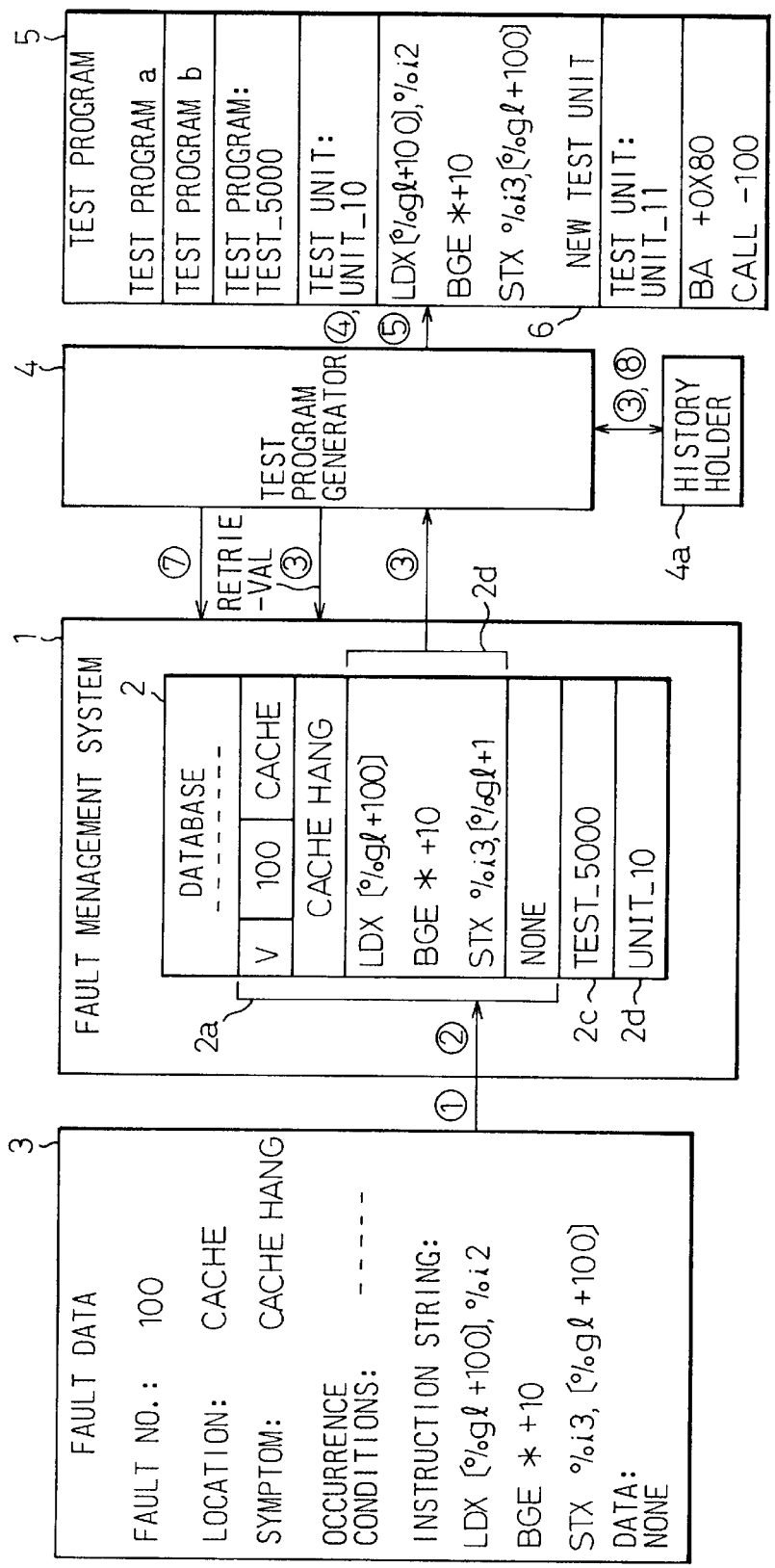
FIG. 15 shows an eighth embodiment of the present invention.

FIG. 15 shows the eighth embodiment of the present invention.

The eighth embodiment conditionally registers a test instruction string. Namely, it scans all test units of each existing test program, to see whether or not an instruction string to be registered is present in the test program. If it is not present, the instruction string is registered as in the first embodiment. If a test unit corresponding to the instruction string exists, the names 2c and 2d of the test program and test unit are sent to the fault management system 1.

In FIG. 15, the fault management system 1 has a database 2 that stores fault data 3. A test program generator 4 generates a test program. A history holder 4a holds a last fault number. A test program 5 is a group of test programs. A new test unit 6 is added to a test program.

The operation of the eighth embodiment will now be explained. The fault data 3 contains a fault number, a location, a symptom, and conditions under which the fault occurs. If instruction data related to the fault is clear, the data is stored in the database 2. In the example of FIG. 15, there is no such data.

The fault data 3 is registered in the database 2. The test program generator 4 fetches a last fault number from the history holder 4a, and retrieves each piece of fault data from the data base 2 according to the last fault number.

The test program generator 4 compares an instruction string 2b contained in the fault data with instruction strings in each test program 5. If there is no corresponding test instruction string in the test program 5, the instruction string 2b is added as a new test unit to the test program 5. Then, the fault number is stored in the history holder 4a. If there is a corresponding test instruction string in the test program 5, the instruction string 2b is not inserted into the test program 5. Thereafter, the name 2c of the test program and the name 2d of the test unit are written in the database 2.

Figure 16:
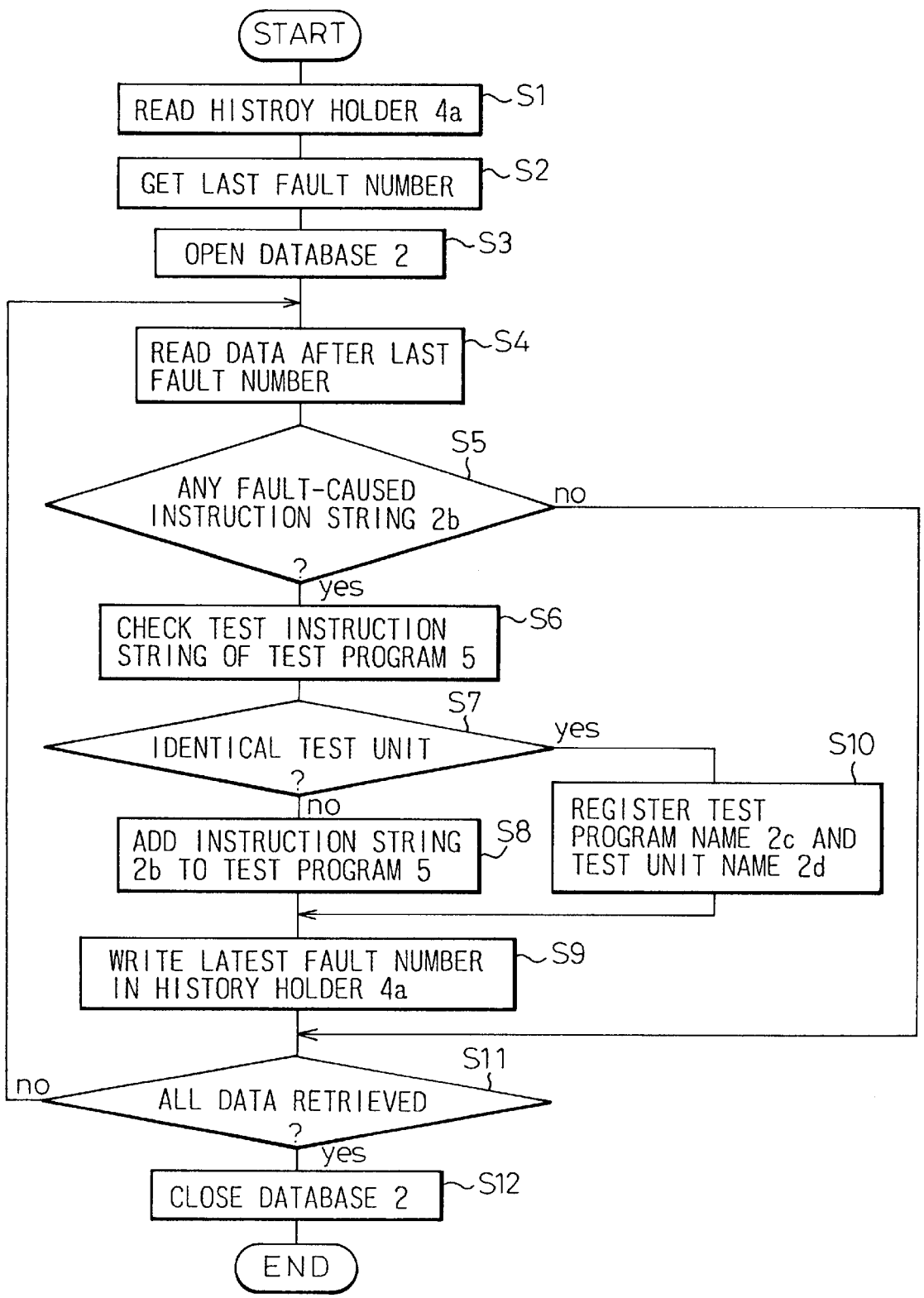
FIG. 16 is a flowchart showing the operation of the eighth embodiment.

FIG. 16 is a flowchart showing the operation of the eighth embodiment.

Step S1 reads the history holder 4a. Step S2 gets a last fault number from the history holder 4a. Step S3 opens the database 2.

Step S4 reads fault data out of the database 2 according to the last fault number. Step S5 determines whether or not the read fault data includes an instruction string 2b. If it includes the instruction string 2b, step S6 checks a test program 5, and if not, step S11 is executed.

Step S7 determines whether or not the test program 5 contains a test unit corresponding to the instruction string 2b. If there is a corresponding test unit, step S10 registers the name 2c of the test program and the name 2d of the test unit in the database 2. If there is no corresponding test unit, step S8 adds the instruction string 2b to the test program 5. Step S9 writes a last fault number in the history holder 4a. Step S11 determines whether or not all fault data have been retrieved from the database 2. If not, the flow returns to the step S4. If all fault data have been retrieved, step S12 closes the database 2.

Figure 17:
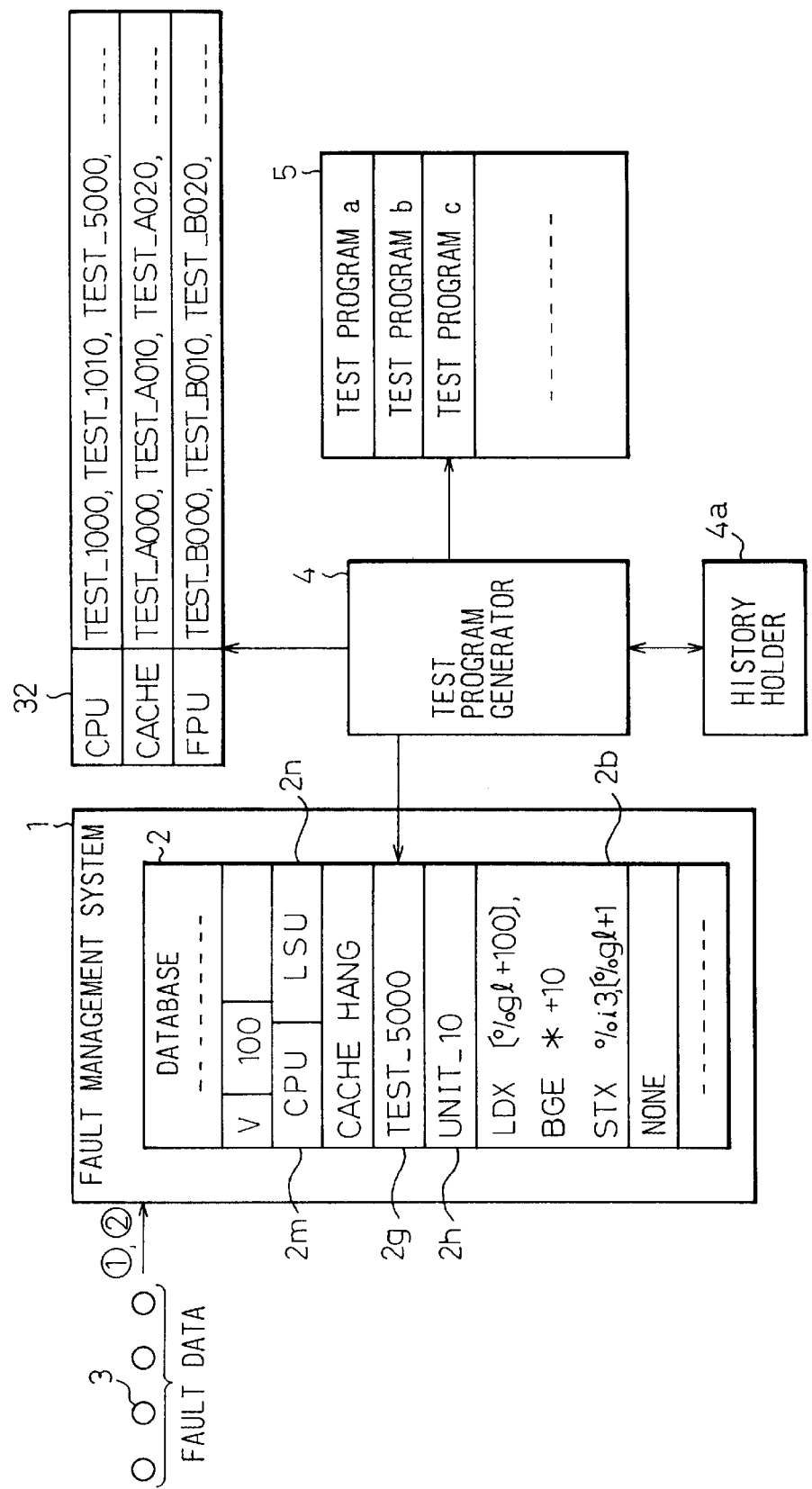
FIG. 17 shows a ninth embodiment of the present invention.

FIG. 17 shows the ninth embodiment of the present invention.

A fault management system 1 has a database 2 that stores fault data 3. A test program generator 4 generates a test program. A history holder 4a holds a last fault number. A test program 5 is a group of test programs a, b, c, and the like. A test program management table 32 manages test programs for hardware blocks, respectively.

When a fault occurs, the test program generator 4 determines whether or not an instruction string related to the fault is already registered. At this time, the test program generator 4 obtains the names of test programs to be checked out of the table 32 according to the name 2m of a hardware unit that has caused the fault, instead of checking every test program. Namely, using the test program management table 32 shortens a time for finding a corresponding test instruction string in test programs.

The operation of the ninth embodiment will now be explained. The fault data 3 contains a fault number, a fault location, a fault symptom, the fault conditions, under which the fault occurred, etc. If specific data related to the fault is clear, the data is also described. In the example of FIG. 17, such data is unclear. The fault data 3 is registered in the database 2.

The test program generator 4 fetches a last fault number from the history holder 4a and reads fault data from the database 2 accordingly. The history holder 4a holds the number of fault data previously processed. The hardware unit 2m that has caused the fault is used as a key to find test programs in the test program management table 32. Each test program found in the table 32 is checked to see whether or not it contains the instruction string 2b.

If the instruction string 2b is found in a test program, the name 2g of the test program and the name 2h of a corresponding test unit are registered in the database 2, which is then closed. If there is no test program that contains the instruction string 2b, the instruction string 2b is added to a test program, and the name of the test program is registered in the table 32.

Figure 18:
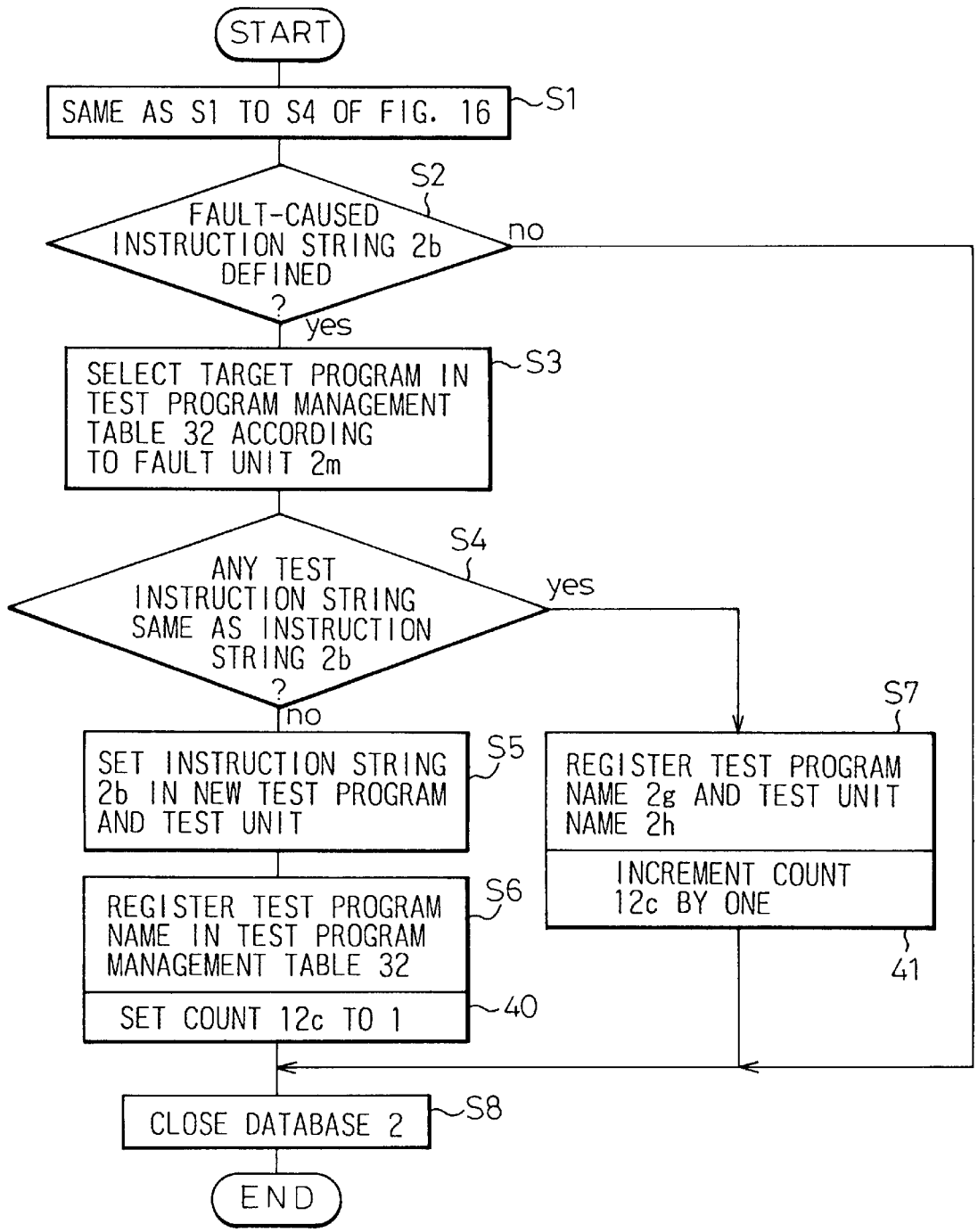
FIG. 18 is a flowchart showing the operations of the ninth and tenth embodiments of the present invention.

FIG. 18 is a flowchart showing the operation of the ninth and tenth embodiments of the present invention.

Processes 40 and 41 of FIG. 18 are only for the tenth embodiment, which employs a management table 32 of FIG. 19.

The ninth embodiment will be explained next with reference to the flowchart of FIG. 18.

Step S1 is the same as the steps S1 to S4 of FIG. 16. Step S2 determines whether or not the retrieved fault data has an instruction string 2b. If it has, step S3 is carried out, and if not, step S8 is carried out. The step S3 uses a fault-caused hardware unit 2m as a key to pick up test programs from the test program management table 32. Step S4 checks each of the picked-up test programs to see whether or not it has a test unit corresponding to the instruction string 2b.

If no test program has the instruction string 2b, step S5 inserts the instruction string 2b as a new test unit into a new test program. Step S6 registers the name of the created test program in the test program management table 32. If some test program has the instruction string 2b, step S7 registers the name 2g of the test program and the name 2h of the test unit in the database 2. Step S8 closes the database 2.

The tenth embodiment of the present invention employs the test program management table 32 of FIG. 19 that is different from the table 32 of FIG. 17.

The table 32 of FIG. 19 contains hardware units 32a, test programs 32b, and fault-detected counts 32c. In order of the counts 32c, the test programs are selected to increase a fault detection rate.

Whenever the test program generator 4 adds a test instruction string as a new test unit to a test program, or finds the test instruction string in an existing test program, a corresponding one of the counts 32c is incremented. A scheduler for checking a corrected fault receives an instruction to run test programs in order of fault detection rates. In this case, the scheduler refers to the test program management table 32, sorts the test programs 32b in order of the counts 32c, and runs the test programs accordingly.

As explained above, the present invention surely and quickly prepares a test program according to fault data. The present invention selects a test program among a wide variety of test programs. The present invention automatically finds a test program or a test unit for confirming a corrected fault according to a fault number, to thereby improve the efficiency of testing the fault.

What is claimed is:

1. A method of automatically generating a test program for testing a hardware fault, comprising the steps of:
    retrieving fault data from a fault management system;
    automatically inserting a test unit corresponding to the fault data into a test program; and,
    if the fault data includes a redundant instruction, automatically inserting into the test program a test unit having at least one of a plurality of different instructions related to the redundant instruction, by looking up a redundant instruction table relating redundant instructions to groups of a plurality of different instructions.

2. The method as set forth in claim 1, further comprising the step of:
    setting a flag in the fault data stored in the fault management system, to indicate that the test unit corresponding to the fault data has been inserted into the test program.

3. The method as set forth in claim 1, further comprising the step of:
    writing information about the test program into the fault data stored in the fault management system after the test unit corresponding to the fault data is inserted into the test program.

4. The method as set forth in claim 1, further comprising the step of:
    transferring the fault data from the fault management system to a test program generator through a network.

5. The method as set forth in claim 1, further comprising the step of:
    automatically selecting, among a plurality of test programs, a test program for testing the hardware fault after the hardware fault is corrected.

6. The method as set forth in claim 5, further comprising the steps of:
    looking up a test unit definition table;
    picking up from the table a test unit corresponding to a hardware unit that has caused the fault; and
    selecting a test program which includes the test unit.

7. The method as set forth in claim 1, further comprising the steps of:
    searching test programs for an instruction string contained in the fault data; and,
    if the instruction string is found in a respective test program, providing the test program as it is.

8. The method as set forth in claim 7, further comprising the steps of:
    looking up a test program management table; and
    picking up from the table a test program for a hardware unit that has caused the fault.

9. The method as set forth in claim 5, further comprising the steps of:
    counting, for each test program, the number of faults related to the test program;
    storing the count in a test program management table; and
    sequentially running the test programs in order of the counts recorded in the table, to test the hardware fault after the fault is corrected.

10. A system for automatically generating a test program for testing a hardware fault, comprising:
    a fault management system for managing fault data;
    a redundant instruction table for relating redundant instructions to groups of a plurality of different instructions;
    a test program generator for retrieving the fault data from the fault management system and automatically inserting a test unit corresponding to the fault data into a test program, and, if the fault data includes a redundant instruction, automatically inserting into the test program a test unit having at least one of a plurality of different instructions related to the redundant instruction, by looking up the redundant instruction table.

11. The system as set forth in claim 10, wherein the test program generator includes a software simulator for logically simulating an instruction string contained in the fault data and automatically adding a result of the simulation as an expected value to the test unit.

12. The system as set forth in claim 10, wherein the fault management system and test program generator are connected to each other through a network to transfer the fault data from the fault management system to the test program generator through the network.

13. The system as set forth in claim 10, wherein the fault management system adds data to the fault data, to indicate that the test unit for the fault data has been inserted into the test program, so that the test program generator may avoid repeatedly inserting the same test unit into the test program.

14. The system as set forth in claim 10, wherein the fault management system adds, to the fault data, retrieval information about the test unit inserted into the test program so that the test program generator may refer to the test unit according to the retrieval information.

15. The system as set forth in claim 14, further comprising a scheduler for checking the hardware fault after the fault is corrected, by controlling the test program according to the retrieval information.

16. The system according to claim 15, further comprising a test program management table looked up by the scheduler to select a test program proper for a hardware unit that has caused the fault.

17. The system according to claim 15, further comprising a fault management table containing, for each test program, the number of faults caused by the test program, so that the scheduler may sequentially run the test programs in order of the numbers of faults.

18. The system according to claim 10, wherein the test program generator has a unit for checking instruction strings contained in the test program, to avoid repeatedly inserting the same instruction string into the test program.

19. An apparatus generating a test program for testing a hardware fault, comprising:
- a fault management system which stores fault data, the fault data including an instruction which causes a hardware fault;
- a redundant expression table storing a redundant expression corresponding to the instruction in the fault data; and
- a test program generator which
  - looks up, in the redundant expression table, the redundant expression corresponding to the instruction in the fault data, and
  - inserts a test unit having the looked up, redundant expression into the test program, to generate a test program for testing the hardware fault.

20. A method of generating a test program for testing a hardware fault, comprising the steps of:
- providing a test program which tests for hardware faults;
- storing fault data including an instruction which causes a specific hardware fault;
- providing a redundant expression table storing a redundant expression corresponding to the instruction in the fault data;
- looking up, in the redundant expression table, the redundant expression corresponding to the instruction in the fault data; and
- inserting a test unit having the looked up, redundant expression into the test program, to generate a test program which tests for the specific hardware fault caused by the instruction.

* * * * *